United States Patent
Sumida et al.

(10) Patent No.: US 7,382,818 B2
(45) Date of Patent: Jun. 3, 2008

(54) DIFFUSION BONDED PUMP CAVITY

(75) Inventors: David S. Sumida, Los Angeles, CA (US); Hans W. Bruesselbach, Monte Nido, CA (US); Steven C. Matthews, St. Pacific Palisades, CA (US)

(73) Assignee: HRL Laboratories, LLC, Malibu, CA (US)

( * ) Notice: Subject to any disclaimer, the term of this patent is extended or adjusted under 35 U.S.C. 154(b) by 493 days.

(21) Appl. No.: 10/340,878

(22) Filed: Jan. 10, 2003

(65) Prior Publication Data

US 2004/0013151 A1    Jan. 22, 2004

Related U.S. Application Data

(60) Provisional application No. 60/348,416, filed on Jan. 10, 2002.

(51) Int. Cl.
*H01S 5/00* (2006.01)
*H01S 3/07* (2006.01)
*H01S 3/093* (2006.01)

(52) U.S. Cl. .................. 372/72; 372/50.1; 372/66

(58) Field of Classification Search .............. 372/6, 372/39, 54, 64, 66, 70, 50.1, 50.22, 69, 94, 372/98
See application file for complete search history.

(56) References Cited

U.S. PATENT DOCUMENTS

| 4,181,900 | A |   | 1/1980  | Tajnai et al. ............ 331/94.5 P |
| --- | --- | --- | --- | --- |
| 4,210,389 | A |   | 7/1980  | Burkhart et al. ............ 350/321 |
| 4,637,028 | A |   | 1/1987  | Kahan .......................... 372/34 |
| 4,969,155 | A |   | 11/1990 | Kahan .......................... 372/70 |
| 5,317,585 | A |   | 5/1994  | Gregor ......................... 372/35 |
| 5,441,803 | A |   | 8/1995  | Meissner .................... 428/220 |
| 5,563,899 | A |   | 10/1996 | Meissner et al. ............. 372/39 |
| 5,761,233 | A |   | 6/1998  | Bruesselbach et al. ........ 372/72 |
| 5,846,638 | A |   | 12/1998 | Meissner .................... 428/220 |
| 5,852,622 | A | * | 12/1998 | Meissner et al. ............. 372/39 |
| 5,936,984 | A |   | 8/1999  | Meissner et al. ............. 372/34 |
| 6,014,391 | A |   | 1/2000  | Byren .......................... 372/34 |
| 6,055,260 | A | * | 4/2000  | Byren et al. .................. 372/72 |
| 6,101,201 | A |   | 8/2000  | Hargis et al. ................. 372/36 |
| 6,246,711 | B1 |  | 6/2001  | Stultz et al. .................. 372/92 |
| 6,646,793 | B2 | * | 11/2003 | Bruesselbach et al. ...... 359/342 |
| 6,738,396 | B2 | * | 5/2004  | Filgas et al. .................. 372/19 |
| 6,894,828 | B2 | * | 5/2005  | Pelouch et al. ............. 359/333 |
| 6,895,152 | B2 | * | 5/2005  | Sumida et al. .............. 385/123 |

* cited by examiner

*Primary Examiner*—Armando Rodriguez
(74) *Attorney, Agent, or Firm*—Ladas & Parry

(57) ABSTRACT

A solid state pump cavity comprising a laser rod encased by diffusion bonding inside an outer cladding. The outer cladding provides the ability to efficiently conduct heat away from the laser rod. The outer cladding is also configured to absorb spontaneous laser radiation that would otherwise be re-amplified by the laser rod. Diffusion bonding of the outer cladding to the laser rod forms a seamless optical boundary between the outer cladding and the laser rod. An alternative embodiment of the pump cavity comprises multiple segments of laser rod and outer cladding assemblies coupled together with undoped sections that are diffusion bonded to the ends of the laser rod and outer cladding assemblies.

37 Claims, 4 Drawing Sheets

DIFFUSION BONDED PUMP CAVITY

CROSS-REFERENCE TO RELATED APPLICATIONS

The present document is related to and claims priority from the copending and commonly assigned patent application document entitled: "Diffusion Bonded Pump Cavity," Ser. No. 60/348,416, filed on Jan. 10, 2002. The entire contents of the related application No. 60/348,416 are hereby incorporated by reference herein.

FIELD

The present invention relates generally to lasers and, more specifically, to pump cavities containing laser rods for solid state lasers.

BACKGROUND

The pump cavity of a solid state laser, in order for the laser to emit electromagnetic radiation, must be excited by an outside source of energy. This source of energy emits radiation itself which is converted by a laser rod within the pump cavity and the laser's other optical components into a laser beam. This source of energy may be a laser lamp or other optical energy sources. Solid state laser rods, as generally true of all laser media, convert much of the absorbed pump power into waste heat. This heat and the thermal gradient induced stresses associated with its removal lead to optical distortion in the form of lensing and birefringence, and ultimately to thermally induced fracture and failure. Thus, in order to counteract these heating problems, a variety of thermal management techniques are employed in the prior art to dissipate the generated heat in an appropriate manner. For example, if the heating is more than about 3 watts (about 35 watts of electrical power to a lamp used to provide pump energy), the laser rod can be cooled by flowing a fluid, such as a liquid or pressurized gas, over the rod. The fluid is recycled through a heat exchanger. Such a dynamic cooling system has various drawbacks. In the case of pressurized gas, a major problem is the high cost of sealing the circulating coolant gas while still permitting transmission of the light from a pump lamp. For liquid systems, the concern is the ultimate deterioration of the fluid upon exposure to the lamp, or pump light.

Because of these problems, another technique for cooling the rod is related to passively cooling the rod by thermal conduction. This technique is exemplified in U.S. Pat. No. 4,210,389 to Burkhart et al, in which the rod is cooled by depositing a reflective metallic layer on one side of the rod, which is soldered to a heat sink. This technique has been found to grossly distort the optical quality of the rod for at least two major reasons. First, because the rod is rigidly held in a thermally conductive support and the rod and the support have different coefficients of thermal expansion, stresses are developed during pumping and cooling; therefore, the rod expands and contracts at a rate different from its support. This unequal expansion and contraction induces stress birefringence. Second, the rod is supported on the support along its length on only a portion of its periphery, which creates a thermal gradient within the rod and a consequent nonuniform cooling. The result is an introduction of optical aberrations in the rod.

U.S. Pat. No. 4,181,900 to Tajnai et al also describes a conductively cooled pump cavity, in which the laser rod is strapped to a heat sink. The Tajnai et al system does not provide a uniform technique for cooling the laser rod since there is no thermal contact around the entire periphery of the rod. The result, like U.S. Pat. No. 4,210,389, is uneven rod cooling with induced thermal stresses. In addition, the straps themselves mechanically stress the rod.

An alternative approach for conductively cooling a laser rod is disclosed by Kahan in U.S. Pat. Nos. 4,637,028 and 4,969,155 and by Gregor in U.S. Pat. No. 5,317,585. These patents disclose a laser rod which is conductively cooled through a transparent outer sleeve, with an intermediate layer of gel used to form an elastomer interface between the rod and the gel. The transparent outer sleeve is preferable made of sapphire, but it may also be made of other optically transparent materials such as glass, single crystal beryllium oxide, and garnet.

Assembly of this apparatus is quite complex. During the manufacture of the apparatus, the laser rod must be held in place with shims within the outer sleeve, until a gel-forming liquid is injected into the sleeve. Once the gel is formed, the shims are removed. The elastomer, since it forms a thermal boundary, must be kept quite thin in order to maintain adequate heat conduction. The thinness of the layer additionally complicates the manufacture of the apparatus. Since the elastomer completely surrounds the laser rod, it must be transparent to pump light to allow for excitation of the laser rod. There are only a limited number of materials suitable for transmission of pump light. Kahan discloses the use of a silicone gel, but this type of gel exhibits out-gassing characteristics, therefore requiring a sealant to be applied to the end boundary points to avoid affecting the laser optical components. Finally, the outer sleeves are generally available only in limited lengths, therefore the design often requires that two sleeve segments be joined together, which additionally complicates the manufacturing process.

Additional concerns with solid state lasers are Amplified Spontaneous Emission (ASE) and parasitic oscillations. ASE occurs when spontaneous laser radiation is amplified during a single pass through the laser media, while parasitic oscillations are ASE which is reflected back into the laser rod. In either case, the energy available for extraction in the preferred direction is reduced. The elastomer disclosed by Kahan and Gregor is generally not a good index match to the rod material, therefore the elastomer provides little suppression of ASE and parasitic oscillations. Suppression of ASE and parasitic oscillations requires that the surface of the rod be fine ground, but this surface grind partially back scatters the pump energy, thus reducing pumping efficiency. Gregor discloses the use of a coating to suppress ASE, but the elastomer layer is located between the ASE-suppressing coating and the laser rod, thus limiting the effectiveness of the coating. This outer coating must be designed to be highly reflective at the pump wavelength and transmissive at the laser wavelength, which requires an expensive multiple layer dielectric coating, Therefore, there exists a need in the art for a method and apparatus for conductively cooling a solid state laser rod which can provide for suppression of amplified spontaneous emission and parasitic oscillations.

SUMMARY

An object of the present invention is to provide a laser pump cavity that efficiently conducts heat energy away from the laser rod within the pump cavity. Another object of the present invention is to provide a pump cavity that absorbs spontaneous laser radiation that would otherwise be re-amplified by the laser rod within the pump cavity.

In accordance with the objections of this invention as described above and to overcome the limitations of the prior art, a pump cavity and a method of making the pump cavity is described that provides for efficient heat conduction and suppression of spontaneous emission along with other advantages.

In accordance with the present invention, a pump cavity is described which comprises a laser rod core having a polygonally-shaped cross-section and a longitudinal axis; and an outer cladding surrounding the laser rod along its longitudinal axis and being diffusion-bonded to the laser rod. The outer cladding is substantially transmissive to pump energy at a first wavelength and is substantially absorptive to laser energy at a second wavelength. The outer cladding may have a circular outer dimension, or a polygonal shape, or any other shape that allows the cladding to be closely coupled to a heat sink means for conducting heat from the outer cladding. A circular outer shape is preferred, as it provides for efficient radial conduction of heat. The outer cladding may be coated with a coating that is highly reflective to the pump energy applied to the pump cavity in the areas where pump energy is not applied and a coating that is anti-reflective to pump energy in those areas where the pump energy is to be applied. The laser rod may comprise solid state laser materials well known in the art, such as neodymium-doped yttrium aluminum garnet (Nd:YAG) or ytterbium-doped yttrium aluminum garnet (Yb:YAG). The outer cladding may comprise cladding materials well known in the art, such as undoped yttrium aluminum garnet (YAG) or, preferably, samarium-doped yttrium aluminum garnet (Sm:YAG). Doped or undoped segments having diameters generally equal to or larger than the diameter of the laser rod may also be diffusion bonded to the ends of the pump cavity to enhance the thermal robustness of the pump cavity or to reduce ground state absorption. Segments comprising saturable absorber material may also be diffusion bonded to one or both ends of a pump cavity according to the present invention to provide Q-switched or mode-locked lasers.

In accordance with the present invention, an alternative pump cavity is described which comprises a plurality of pump cavity segments, each pump cavity segment comprising: a laser rod core having a polygonally-shaped cross-section and a longitudinal axis; and an outer cladding surrounding the laser rod along its longitudinal axis and being diffusion-bonded to the laser rod; and one or more extension segments disposed between the pump cavity sections of the plurality of pump cavity sections, the extension segments being diffusion bonded to the pump cavity sections and having outer dimensions generally equal to outer dimensions of the outer cladding in each pump cavity section. The outer cladding is substantially transmissive to pump energy at a first wavelength and is substantially absorptive to laser energy at a second wavelength. The outer cladding in each pump cavity section may have a circular outer dimension, or a polygonal shape, or any other shape that allows the cladding to be closely coupled to a heat sink means for conducting heat from the outer cladding. A circular outer shape is preferred, as it provides for efficient radial conduction of heat. The outer cladding in each pump cavity section may be coated with a coating that is highly reflective to the pump energy applied to the pump cavity in the areas where pump energy is not applied and a coating that is anti-reflective to pump energy in those areas where the pump energy is to be applied. The laser rod in each pump cavity section may comprise solid state laser materials well known in the art, such as neodymium-doped yttrium aluminum garnet (Nd:YAG) or ytterbium-doped yttrium aluminum garnet (Yb:YAG). The outer cladding in each pump cavity section may comprise cladding materials well known in the art, such as undoped yttrium aluminum garnet (YAG) or, preferably, samarium-doped yttrium aluminum garnet (Sm:YAG). The extension segments may comprise undoped or doped materials. Saturable absorber material may be formed from doped material. If saturable absorber material is used in one or more of the extension segments, the pump cavity may be used to provide a Q-switched or mode-locked laser. Undoped segments having diameters generally equal to the outer dimensions of the outer cladding may also be diffusion bonded to the ends of the pump cavity to enhance the thermal robustness of the pump cavity or to reduce ground state absorption.

A method of making a pump cavity according to the present invention comprises the steps of: specifying the polygonal shape for the core; providing a core material slab having an upper surface, a lower surface, a first optically flat surface, and a second optically flat surface opposite the first optically flat surface, the first and the second optically flat surfaces disposed between and generally perpendicular to the upper surface and the lower surface; providing a plurality of cladding material slabs, each slab having at least one optically flat surface; diffusion bonding the optically flat surface of one slab of the plurality of cladding material slabs to the first optically flat surface of the core material slab; diffusion bonding the optically flat surface of another slab of the plurality of cladding material slabs to the second optically flat surface of the core material slab to form a composite structure; grinding and polishing the composite structure to remove at least some portion of the core material remaining from the core material slab to provide a new optically flat surface comprising at least some portion of the core material slab; diffusion bonding the optically flat surface of another slab of the plurality of cladding material slabs to the new optically flat surface comprising at least some portion of the core material slab of the composite structure; and repeating the steps of diffusion bonding the optically flat surface of another cladding material slab and grinding and polishing the composite structure until the core material from the core material slab is completely surrounded by cladding material to provide the laser pump cavity wherein the core has the specified polygonal shape. Preferably, the cladding material is substantially transmissive to pump energy at a first wavelength and is substantially absorptive to laser energy at a second wavelength. Additional steps may be used to grind and polish the composite structure until the resulting pump cavity has a desired cross-sectional shape, or the resulting pump cavity may be obtained by core-drilling the composite structure to extract the laser rod core and a portion of the surrounding cladding material. Finally, additional steps may be used to apply highly-reflective coatings, anti-reflective coatings, or both types of coatings.

In accordance with the present invention, an alternative pump cavity is described which comprises a laser rod having a longitudinal axis and a first end and a second end, the laser having a cross-section with one or more flat sides, the one or more flat sides being optically flat along the longitudinal axis; and one or more cladding material slabs each having a least one optically flat surface, the each one of the or more flat sides of the laser rod being diffusion-bonded to the optically flat surface of at least one of the one or more cladding materials slabs.

Also in accordance with the present invention, a method of designing a laser pump cavity is described, the method comprising the steps of: specifying a cross-sectional shape for a core, the cross-sectional shape having one or more substantially flat sides; providing a laser rod with the specified cross-sectional shape, the laser rod having a longitudinal axis and each substantially flat side of the one or more flat sides extending along the longitudinal axis; making at least one flat side of the core optically flat; providing one or more cladding material slabs, each cladding material slab having at least one optically flat side; and diffusion bonding the optically flat sides of one or more cladding material slabs to each one of the optically flat sides of the laser rod.

DETAILED DESCRIPTION

Figure 1A:
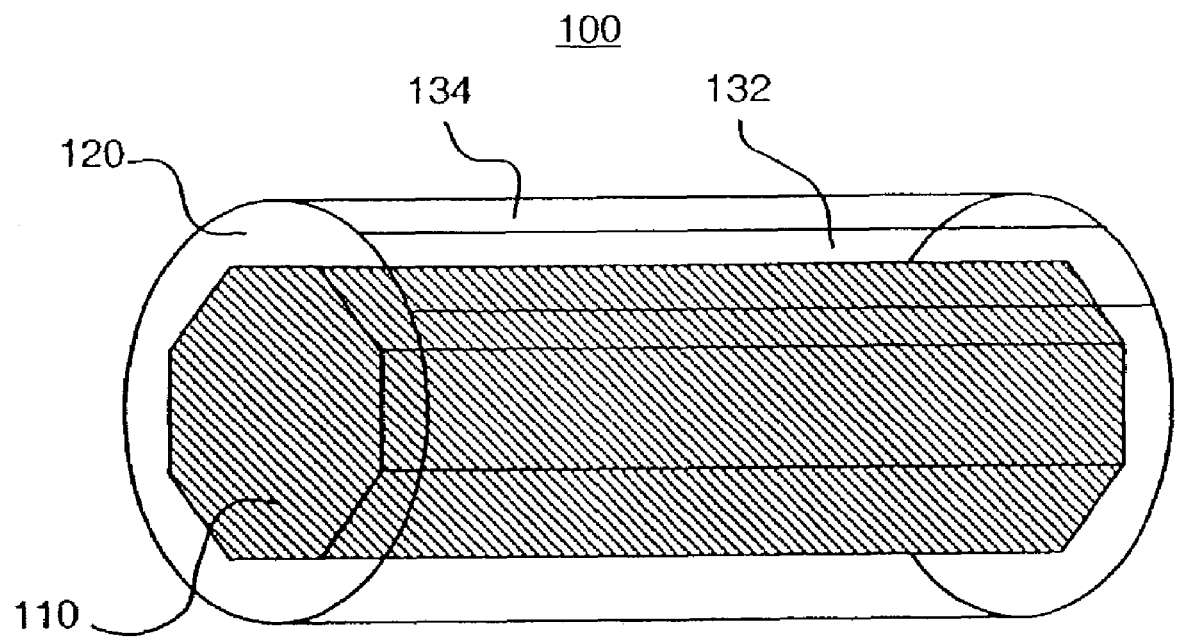
FIG. 1A is an isometric view of one embodiment of a pump cavity according to the present invention.
Figure 1B:
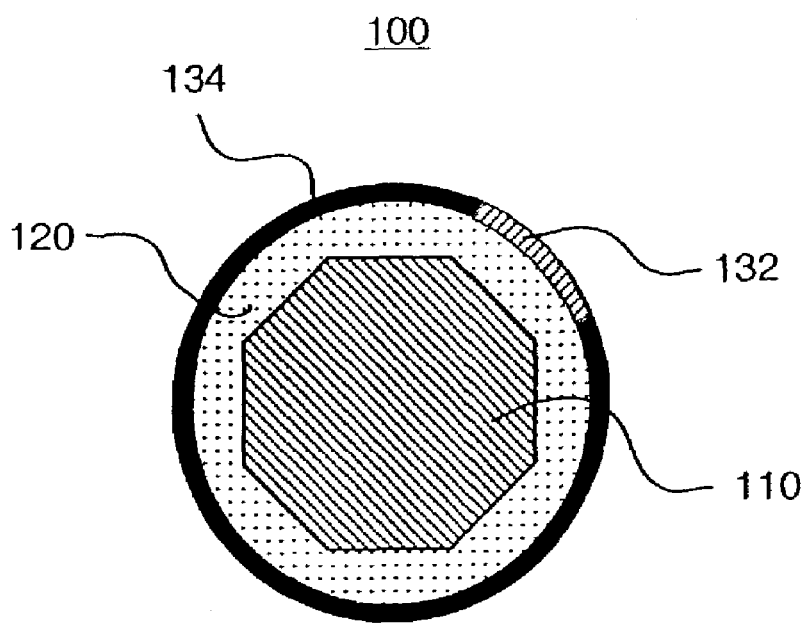
FIG. 1B is a cross-sectional view of the embodiment of a pump cavity shown in FIG. 1A.

Referring first to FIGS. 1A and 1B, one embodiment of a pump cavity 100 according to the present invention is provided by a polygonally-shaped laser rod 110 encased within an outer cladding 120. FIG. 1A shows an isometric view of the laser rod 110 and cladding 120. FIG. 1B shows a cross-section of the laser rod 110 and cladding 120. The outer cladding 120 is preferably coated with a coating 134 which is highly reflecting at the wavelength of the pump light, except for those regions where the pump energy is to be applied. Those regions are preferably coated with a coating 132 which is anti-reflecting at the wavelength of the pump light.

The overall length of the pump cavity 100 is typically several centimeters, however, those skilled in the art would appreciate that shorter or longer pump cavities 100 according to the present invention may be created. The overall length is generally limited by the fabrication techniques used to create the laser rod 110 or cladding material 120. The diameter of the laser rod is typically 5-8 mm and the cladding 120 generally has a thickness of 1-2 mm. The laser rod 110 may have a larger diameter, but the upper range of the diameter may be limited by the techniques used to fabricate the laser rod 110. The laser rod 110 may have a diameter smaller than 1 mm, but the lower range of the diameter may be limited by the diffusion bonding techniques described below.

The cladding 120 is diffusion bonded to the laser rod 110. The materials used for the laser rod 110 can be any number of activated host crystals or glasses known in the art. Typical materials are Nd:YAG or Yb:YAG. The outer cladding 120 may be comprised of any material that (1) has sufficient thermal conductivity to transport heat from the rod 110; (2) has a close match in properties, particularly the coefficient of thermal expansion (CTE), to the materials used for the laser rod 110 to allow the cladding to be diffusion bonded to the laser rod 110 and to allow for subsequent thermal expansion; and, very importantly, (3) since ASE is an issue for high gain materials such as Nd:YAG, is intrinsically absorbing at the laser wavelength and transmissive at the pump wavelength, or is capable of being doped with an impurity ion which will produce the same effect. It is also preferable that the outer cladding have a close match in refractive index to the core to eliminate the Fresnel reflection at the core-cladding boundary. Typical materials for the outer cladding is undoped YAG, if ASE is not a concern, or samarium doped YAG, for ASE suppression.

The outer coating on the cladding may comprise two separate sections of coatings. As indicated above, the first coating section 134 only has to be highly reflecting at the wavelength of the pump energy. Highly reflecting coatings are well known in the art. The second coating section 132 only has to be anti-reflective at the wavelength of the pump energy, to allow for pump energy to be coupled into the laser rod. Anti-reflective coatings, such as those provided by multiple layer coatings, are also well known in the art. However, simple metallic coatings may also be used, rather than coatings with more expensive single or multiple wavelength dielectric characteristics. Unlike the prior art, the amplified spontaneous radiation from the laser rod is absorbed in the outer cladding. Prior art apparatus use selective high reflectivity coatings, which are difficult to fabricate in practice, and are not as effective at suppressing amplified spontaneous emission as is the doped cladding.

Diffusion bonding is a process whereby the items to be joined are first polished and optically contacted, then subjected to heating near the melting point such that the two contact surfaces fuse together. Methods for diffusion bonding are described in detail in U.S. Pat. No. 5,441,803, "Composites Made From Single Crystal Substances," issued Aug. 15, 1995 to H. E. Meissner and U.S. Pat. No. 5,846,638, "Composite Optical And Electro-Optical Devices," issued Dec. 8, 1998, also to Meissner, both documents being incorporated herein by reference. The bonding steps as they apply to the present invention are described in additional detail below. Diffusion bonding, when correctly done, provides a seamless optical boundary between the laser rod and the outer cladding. Circular "whispering" modes around the outer boundary of the laser rod cannot occur since there is no gain material at the total internal reflection crystal-to-air interface. Indeed, when the cladding is Sm:YAG, the material is lossy. In addition, since the outer cladding is directly bonded to the laser rod, with no intervening layer, the heat conduction from the laser rod to the outer cladding is very efficient. Other methods of bonding optical materials together are acceptable, as long as the resulting pump cavity is as if it were formed from a single piece of material, that is, a good refractive index match must exist.

As described in the Meissner references, diffusion bonding essentially involves three steps. The first step is to precision polish and clean the contact surfaces of the objects to be bonded. For diffusion bonding to properly occur, these surfaces should be made optically flat across their entire lengths and widths. Preferably, the flatness is less than one wavelength of visible light per 5 cm to 10 cm of the surfaces. The objects to be bonded may also be preheated to remove any absorbed water or gasses from the contact surfaces.

The second step in diffusion bonding is to optically contact the contact surfaces. If the contact surfaces are sufficiently flat and clean, interference fringes will be immediately seen when the contact surfaces are brought into contact with each other. Optical contact is generally indicated by the absence of interference fringes. As the contact surfaces grip each other due to Van der Waals attraction, the interference fringes will spread out until they are no longer seen. At that point, the contact surfaces are in optical contact with each other. Pressure may be applied to the objects to enhance the grip between the contact surfaces, but this pressure should not be required as the attractive forces between the contact surfaces should be enough to hold the contact surfaces together.

The final step in diffusion bonding is the gradual heating of the objects in optical contact with each other at the contact surfaces to form a permanently bonded composite construct. Diffusion bonding occurs at temperatures below the fusion temperature for the materials in the separate objects, but at a temperature and for a time sufficient to diffusion bond the contact surfaces. For crystalline substances such as doped and undoped YAG, the bonding temperature is generally in the range of 0.4 to 0.9 times the melting temperature of the object to be bonded having the lowest melting temperature. After heating the objects for a sufficient time to achieve bonding, the composite construct is cooled at a rate which allows annealing of the residual stresses in the materials. Heating for diffusion bonding causes the release of existing stresses within the crystalline and atomic structures to be alleviated; however, cooling must be conducted at a sufficiently slow rate so that the stresses will not reappear. The rate of cooling is determined by the relevant surfaces, coefficients of thermal expansion of the materials, and the dimensions of the elements within the composite. After the diffusion boding process is completed to form a composite construct, the construct can undergo further processing such as cutting, milling, grinding, and polishing.

Figure 2A:
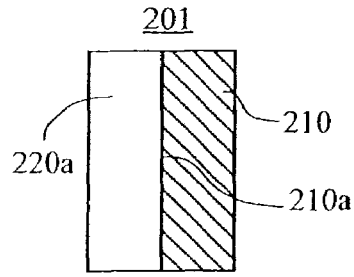
FIGS. 2A-2J depict a process for fabricating an embodiment of a pump cavity according to the present invention.

A preferred method of forming a octogonally-shaped core within cladding material to form a pump cavity by diffusion bonding is depicted in FIGS. 2A-2J. Those skilled in the art will appreciate that the method described below may be used to fabricate cores with any number of sides. The first step is depicted in FIG. 2A, which shows the bonding of a core material slab 210 with a first cladding material slab 220a. The two slabs 210, 220a are bonded at a first core material contact surface 210a. The procedure discussed above may be used to diffusion bond the two slabs 210, 220a to form a first composite construct 201, or other procedures, known in the art, may be used to form the composite construct 201.

Figure 2B:
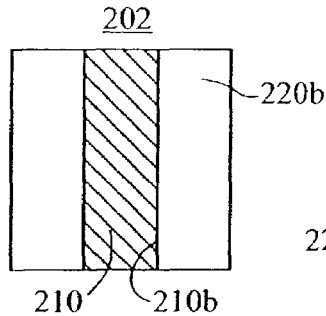

The next step of forming a pump cavity is depicted in FIG. 2B. In FIG. 2B, a second cladding material slab 220b is diffusion bonded to a second core material contact surface 210b of the core material slab 210. The second core material contact surface 210b is opposite the first core material contact surface 210a. Note again that the second core material contact surface and the second cladding material slab must be prepared for diffusion bonding by grinding and polishing the contacting surfaces to optical flatness. After diffusion bonding, a second composite construct 202 is formed, with the core material slab 210 sandwiched between the cladding material slabs 220a, 220b.

Figure 2C:
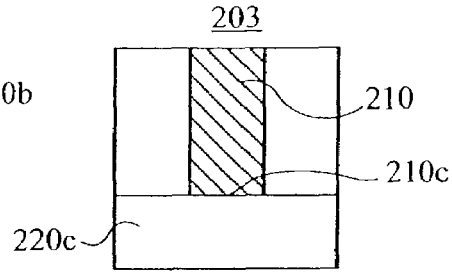

FIG. 2C depicts the bonding of a third cladding material slab 220c to the second composite construct 202 to form a third composite construct 203. The diffusion bonding of the third cladding material slab 220c may require that the second composite construct 202 be cut or milled to form the proper dimensions of the core. However, as indicated above, a composite construct formed by diffusion bonding should be considered as a single piece of material. Hence, cutting and milling processes can be performed on the composite construct in much the same fashion as they would be performed on a single piece of material. After the second composite construct 202 is cut or milled to receive the third cladding material slab 220c, both the contacting surface of the third core material slab 220c and the composite construct third contact surface 210c are precision polished and cleaned to form optically flat surfaces to enable the diffusion bonding of the third core material slab 220c to the second composite construct 202. After these elements are diffusion bonded, a third composite construct 203 is formed.

Figure 2D:
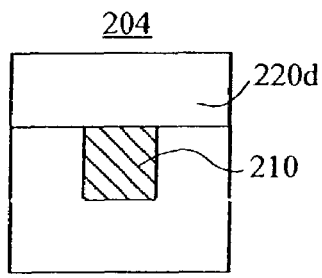
Figure 2E:
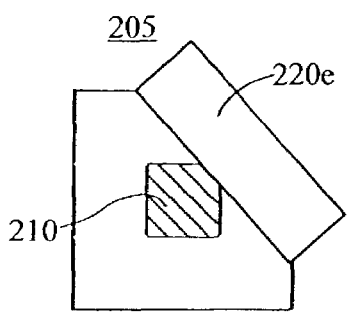
Figure 2F:
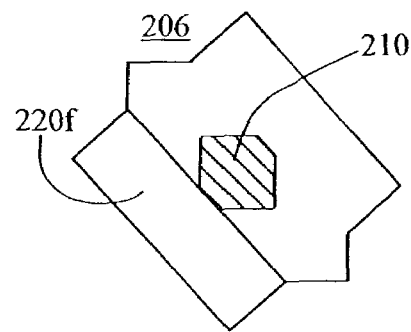
Figure 2G:
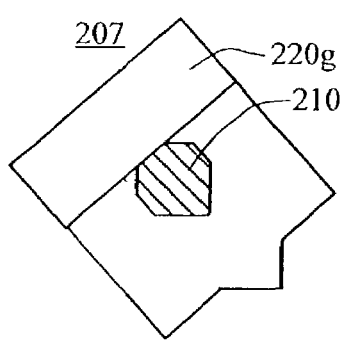
Figure 2H:
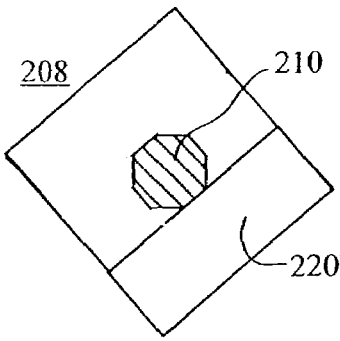

FIGS. 2D-2H depict the remaining steps of cutting or milling the composite construct and diffusion bonding each additional cladding material slab 220d, 220e, 220f, 220g, 220h to form another composite construct 204, 205, 206, 207, 208. As shown in FIG. 2D, a fourth cladding material slab 220d is diffusion bonded to the third composite construct 203 opposite the third cladding material slab 220c to form a fourth composite construct 204. FIG. 2E depicts the diffusion bonding of a fifth cladding material slab 220e at a first corner of the fourth composite construct 204 to form a fifth composite construct 205. FIG. 2F depicts the diffusion bonding of a sixth cladding material slab 220f at a second corner opposite the first corner to form a sixth composite construct 206. FIG. 2G depicts the diffusion bonding of a seventh cladding material slab 220g to form a seventh composite construct 207 and FIG. 2H depicts the diffusion bonding of an eighth material slab 220h to form an eight composite construct 208. Careful cutting or milling of each composite construct will ensure that the resulting core 210 as shown in FIG. 2I will have the desired dimensions.

A circular or nearly-circular core 210 is preferable to facilitate heat conduction from the core, reduce ASE, and to provide improved gain for laser beams with circular modes. Therefore, the more sides that the polygonally-shaped core has, the more the shape of the core will approach that of a circle. However, as shown above, the number of fabrication steps is directly proportional to the number of sides that the polygonally-shaped core has. An increased number of fabrication steps used to produce a pump cavity according to the present invention is likely to result in increased fabrication cost. Note also that the diffusion bonding technique may limit the lower bound of core diameter. The precision grinding and polishing required to provide the optically flat surfaces for diffusion bonding may be more difficult to achieve when the initial core material slab has an extremely small initial thickness. However, as techniques for the control of such precision grinding and polishing improve, it is expected that provision of smaller core diameters will be easier to obtain. Note also that a pump cavity according to the present invention may have a core that does not have an equilateral polygonal shape, that is, the sides of the core cross-section may have different lengths. Pump cavities according to the present invention may have cores with rectangular or other non-equilateral polygon cross-sectional shapes.

Figure 2I:
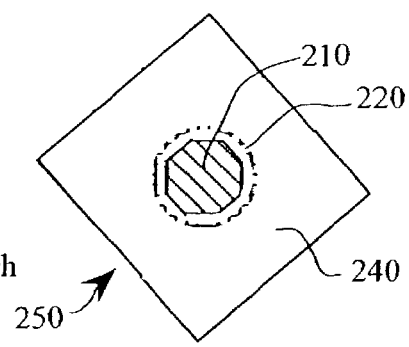

FIG. 2I depicts the resulting composite pump cavity 250. Additional milling, cutting, and polishing may be used to form a pump cavity with the desired outer cross-sectional shape. A desired pump cavity may also be formed from the resulting composite pump cavity 250 by core-drilling, a technique well-known in the art, to extract the core 210 and surrounding cladding 220 from excess cladding material 240 to obtain a cored composite structure. As discussed above, a circular cross-section may be preferred. Note that the creation of the final cross-sectional shape may require additional precision manufacture, since its is preferable that the core 210 be perfectly centered within the cladding 240. Note also that other final cross-sectional shapes may be formed.

Figure 2J:
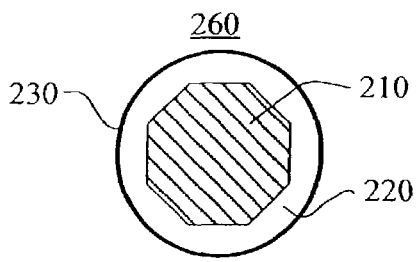

FIG. 2J depicts the pump cavity 260 after the composite pump cavity 250 has been fabricated to have a circular outer cross-section. FIG. 2J also depicts the pump cavity 260 after coatings 230 have been applied to the outer surface of the cladding material of the pump cavity. Grinding and polishing, or other methods known in the art, may be used to prepare the outer surface of the pump cavity for the receipt of these coatings. As discussed above, coatings which are anti-reflective to the wavelengths of the pump energy and the laser energy are used in those portions of the surface of laser pump cavity at which the pump energy is to be applied, while the rest of the surface is coated with material that is highly reflective to the wavelengths of the pump energy, while anti-reflective to the wavelengths of the laser energy. Coating of the cavity in this manner prevents the re-reflection of spontaneous laser radiation, and thus reduces ASE.

Fabrication of the pump cavity as described above can be performed by the supplier of the laser rod structure. Thus, no additional manufacturing steps are required to form the complete pump cavity when it is assembled into a laser unit, when the laser unit incorporating the pump cavity is fabricated. This decreases the cost of the construction of the laser unit and increases the quality and reliability of the laser unit.

Figure 3:
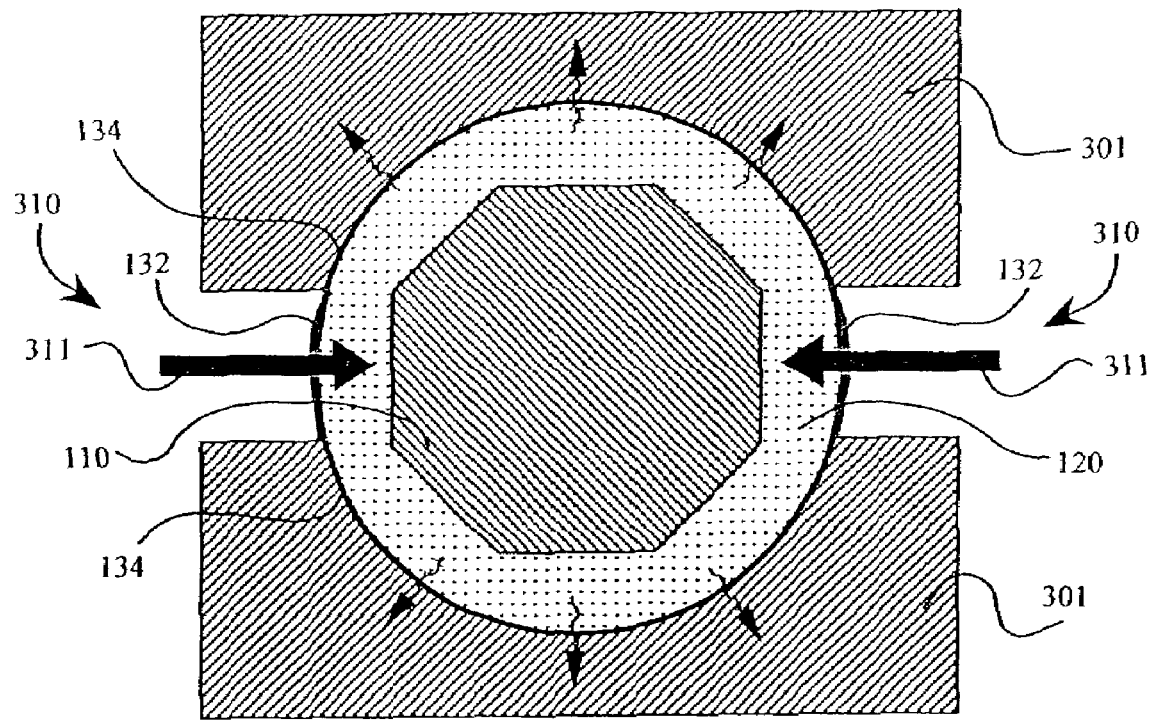
FIG. 3 shows a heat-sink and pump cavity combination according to an embodiment of the present invention.
Figure 4:
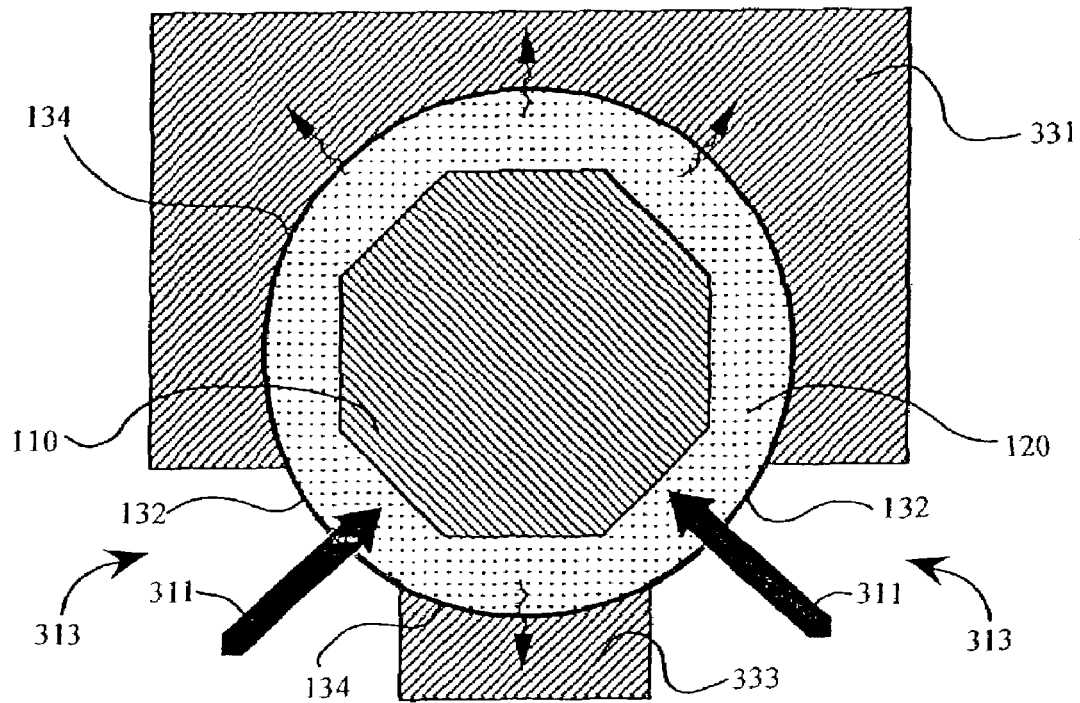
FIG. 4 shows an alternative heat-sink and pump cavity combination according to an embodiment of the present invention.

A major advantage of the present invention is the conduction of heat from the laser rod by the outer cladding. However, this heat must still be conducted away from the outer cladding, while still allowing pump energy to be applied to the laser rod. Heats sinks, well-known in the art, may be used for this purpose. FIGS. 3 and 4 show two possible orientations of heat sinks in relation to the laser rod and cladding composite of the pump cavity where the pump cavity is side-pumped. Note also that a pump cavity according to the present invention may also be end-pumped.

In FIG. 3, two semi-circular heat sinks 301 are positioned above and below and directly adjacent the laser rod 110 and cladding 120 composite. The heat sinks 301 preferably extend the entire length of the rod. Slits 310 are provided between the two heat sinks 301, to allow for the application of pump energy 311. The slits 310 face each other, so that the angle between the pump energy as applied to the laser rod 110 from pump energy sources is generally 180°. This orientation of the heat sinks 301 allows for pumping of the laser rod 110 from light pump sources (not shown), such as diode arrays or flashlamps, that are directly opposite each other. In the area of the cladding where the pump energy is applied, the outer cladding 120 is preferably coated with a coating 132 that is anti-reflective at the pump wavelength. The rest of the cladding 120 is preferably coated with a coating 134 that is highly reflective at the pump energy wavelength, as previously described. A curved, circular or nearly circular, outer circumference is preferred for the outer cladding 120, as this best assures a radial heat flow away from the rod 110. Heat can then be extracted from the heat sinks 301 using convective cooling, liquid cooling, or other techniques known in the art.

In FIG. 4, a first heat sink 331 is positioned around a majority of the outer surface of the outer cladding 120 containing the laser rod 110. Two slits 313 are provided to allow for the application of pump energy 311 to the laser rod 110. Unlike the configuration shown in FIG. 3, the two slits 313 are not positioned so that they face each other, rather the slits 313 are positioned so that the angle between the pump energy 311 applied to the laser rod is less than 180°. Preferably, the outer cladding 120 is coated with a pump energy anti-reflective coating 132 at the slits, and a pump energy highly reflective coating 134 everywhere else. A second heat sink 333 may be used between the slits 313 to provide additional conduction of heat away from the laser rod 110. As above, the outer cladding 120 may have a circular outer circumference to facilitate conduction of heat away from the laser rod 110, or may have any other shape that facilitates the coupling of the heat sinks 331, 333 to the outer cladding 120.

Figure 5:
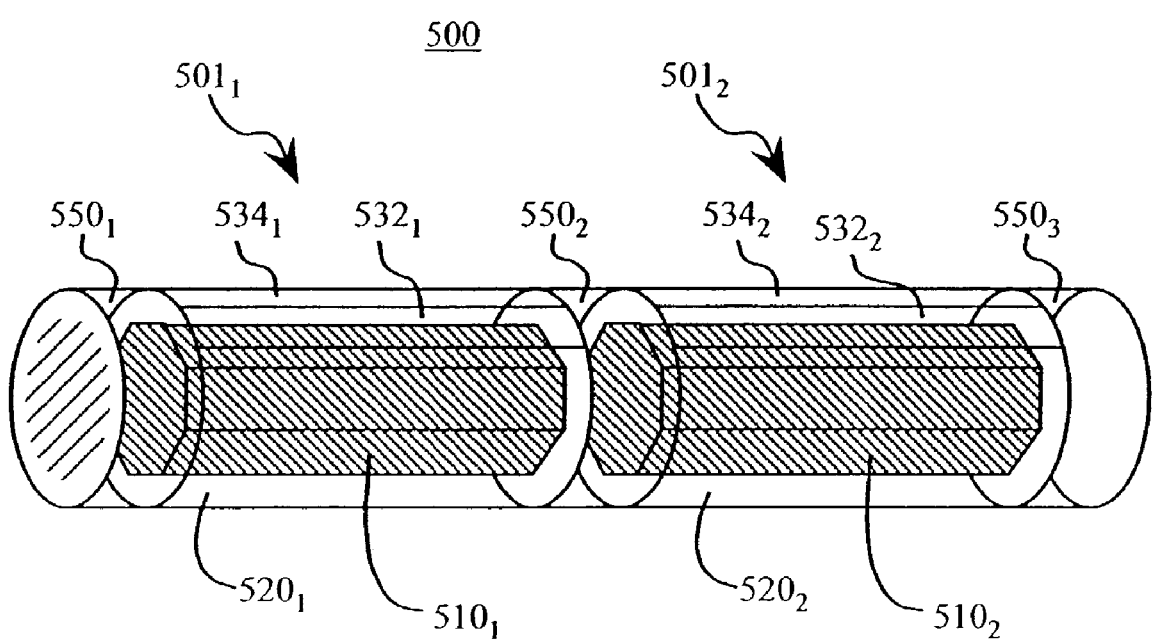
FIG. 5 shows another embodiment of the present invention resulting from two pump cavities diffusion bonded with extension segments.

FIG. 5 depicts and alternative embodiment of a pump cavity 500 constructed from two diffusion bonded pump cavity segments $501_1$, $501_2$. A middle extension segment $550_2$ is used to join the two pump cavity segments $501_1$, $501_2$. A first end extension segment $550_1$ is disposed in front of the first pump cavity segment $501_1$, and a second end extension segment $550_3$ is disposed at the back end of the second pump cavity segment $501_2$. The two pump cavity segments $501_1$, $501_2$, each comprise a doped laser rod $510_1$, $510_2$, an outer cladding $520_1$, $520_2$, a pump energy highly reflective coating $534_1$, $534_2$, and a pump energy anti-reflective coating $532_1$, $532_2$. Pump energy is applied at the areas where the pump energy anti-reflective coating $532_1$, $532_2$ is present on each pump cavity $501_1$, $501_2$. The extension segments $550_1$, $550_2$, $550_3$ may comprise undoped material similar to that used for the laser rods $510_1$, $510_2$, or other materials known in the art for providing saturable absorption.

Undoped extension segments at one or both ends of a pump cavity may provide advantages for the mounting, the robustness, and the performance of the cavity. The undoped extension segments are not pumped, so deploying such segments at either or both ends of the laser cavity allows the pump cavity to be mounted at the extension segments while avoiding the pump energy sources. It is also noted that the ends of the pump cavity may get so hot that the exposed ends of the pump cavity bulge, which can result in thermal fracture. Diffusion bonding of undoped segments onto the ends of the pumped cavity prevents the bulging of the pump cavity ends and reduces the likelihood of thermal fracture of the laser rod. If the laser media is 3-level or quasi 3-level media, the unpumped regions of the media undergo ground state absorption at the lasing wavelength. Use of undoped extension segments allows the laser rod to be held at the extension segments, so that pump energy can be applied along the entire length of the laser media. Since unpumped regions of the laser media are minimized, ground state absorption losses are minimized. Therefore, diffusion bonding of the extension segments to the pump cavity segments provides the high quality optical contact between the extension segments and the cavity segments so that the undoped extension segments eliminate the ground state absorption loss. Alternative embodiments of the present invention may use only a single pump cavity with undoped extension segments diffusion bonded on either end, or more than two pump cavities combined with undoped extension segments.

Another advantage provided by coupling individual pump cavity segments $501_1$, $501_2$ together by diffusion bonding is that the overall length of the resulting pump cavity is longer and can thus produce a higher energy laser beam. However, a problem that arises in extending the length of the pump cavity is that parasitic oscillations and ASE will increase as the length increases. Pump cavity segments according to the present invention may provide for reduced ASE and parasitic oscillations in the resulting extended pump cavity if the cladding material used in the pump cavity segments has ASE absorption characteristics.

Another embodiment of a pump cavity according to the present invention has at least one doped section diffusion bonded to the end or ends of one or more pump cavity segments. Preferably, the doped section comprises saturable absorber material. The use of saturable absorber material in at least one of the doped sections provides the ability to implement a Q-switched or mode-locked laser with the extended pump cavity. The doping and host medium required for saturable absorber material is well known in the art for certain wavelengths of interest.

An alternative embodiment of a pump cavity according to the present invention may have a laser rod that has a cross-section that is not completely polygonal. In this embodiment, the laser rod may have one or more sides which are optically flat, which allows for cladding material slabs, with optical flat surfaces, to be diffusion-bonded to the optically flat sides of the laser rod. Preferably, the cladding material slabs completely surround the laser rod to provide for the thermal advantages and reduced ASE and parasitic oscillations described above. Also, pump cavity segments comprising laser rods that are not completely polygonal may be coupled with doped or undoped segments as described above. Doped or undoped segments may also be disposed at the end of the pump cavity. Materials used for the laser rod and the cladding material may be as described above.

From the foregoing description, it will be apparent that the present invention has a number of advantages, some of which have been described above, and others of which are inherent in the embodiments of the invention described above. Also, it will be understood that modifications can be made to the pump cavity and the method of making it described above without departing from the teachings of subject matter described herein. As such, the invention is not to be limited to the described embodiments except as required by the appended claims.

What is claimed is:

1. A composite structure comprising:
   a laser rod having a polygonally-shaped cross-section and a longitudinal axis and having a first end and a second end; and
   an outer cladding surrounding the laser rod along its longitudinal axis and being diffusion bonded to the laser rod,
   wherein the composite structure is a laser pump cavity and wherein the cladding is substantially devoid of concave outer surfaces;
   wherein the laser pump cavity is provided for being pumped with pump energy at a first wavelength and for producing laser energy at a second wavelength, and wherein said outer cladding is substantially transmissive at said first wavelength and is substantially absorptive at said second wavelength.

2. The composite structure according to claim 1, wherein the outer cladding has an outer cross sectional shape that is circular or elliptical.

3. A composite structure comprising:
   a laser rod having a polygonally-shaped cross-section and a longitudinal axis and having a first end and a second end; and
   an outer cladding surrounding the laser rod along its longitudinal axis and being diffusion bonded to the laser rod,
   wherein the composite structure is a laser pump cavity and wherein the cladding is substantially devoid of concave outer surfaces, wherein the outer cladding has an outer cross sectional shape that is polygonally-shaped.

4. The composite structure according to claim 1, wherein the laser rod comprises neodymium doped yttrium aluminum garnet.

5. The composite structure according to claim 1, wherein the laser rod comprises ytterbium doped yttrium aluminum garnet.

6. The composite structure according to claim 1, wherein the outer cladding comprises yttrium aluminum garnet.

7. The composite structure according to claim 1, wherein the outer cladding comprises samarium-doped yttrium aluminum garnet.

8. The composite structure according to claim 1, wherein the laser rod and the outer cladding have the same length and further comprising:
   one or more extension segments disposed at the first end, or the second end, or both ends of the laser rod, the extension segments being diffusion bonded to the laser rod and the outer cladding.

9. The composite structure according to claim 8, wherein the extension segments comprise undoped material.

10. A composite structure comprising:
    a laser rod having a polygonally-shaped cross-section and a longitudinal axis and having a first end and a second end; and
    an outer cladding surrounding the laser rod along its longitudinal axis and being diffusion bonded to the laser rod,
    wherein the composite structure is a laser pump cavity and wherein the cladding is substantially devoid of concave outer surfaces;
    wherein the laser rod and the outer cladding have the same length and further comprising:
    one or more extension segments disposed at the first end, or the second end, or both ends of the laser rod, the extension segments being diffusion bonded to the laser rod and the outer cladding; and
    wherein at least one of the extension segments comprises saturable absorber material.

11. A composite structure comprising:
    a laser rod having a polygonally-shaped cross-section and a longitudinal axis and having a first end and a second end; and
    an outer cladding surrounding the laser rod along its longitudinal axis and being diffusion bonded to the laser rod,
    wherein the composite structure is a laser pump cavity and wherein the cladding is substantially devoid of concave outer surfaces; further comprising:
    one or more heats sinks surrounding the outer cladding and being disposed against the outer cladding to conduct heat from the outer cladding; and
    one or more slits in the heat sinks, the slits extending to the outer cladding and having a width and length to allow pump energy to be coupled to the pump cavity.

12. The composite structure according to claim 11, wherein the slits are disposed in pairs and each slit in the pairs of slits being disposed at an angle of 180° to the other slit in the pair, the angle being measured from a center of the laser rod to the slit.

13. The composite structure according to claim 11, wherein the slits are disposed in pairs and each slit in the pairs of slits being disposed at an angle of less than 180° to the other slit in the pair, the angle being measured from a center of the laser rod to the slit.

14. A laser pump cavity pumped with pump energy at a first wavelength and producing laser energy at a second wavelength, said laser pump cavity comprising:
    a plurality of pump cavity segments, each pump cavity segment comprising:
    a laser rod having a polygonally-shaped cross-section and a longitudinal axis; and an outer cladding surrounding the laser rod along its longitudinal axis and being diffusion-bonded to the laser rod,
wherein said outer cladding is substantially transmissive at said first wavelength and is substantially absorptive at said second wavelength; and
one or more extension segments disposed between the pump cavity sections of the plurality of pump cavity sections, the extension segments being diffusion bonded to the pump cavity sections.

15. The laser pump cavity according to claim 14, wherein each pump cavity segment further comprises:
one or more sections of a layer of a first material coating the outer cladding, the layer of the first material being highly reflective to pump energy applied to the pump cavity section and being disposed on areas of the outer cladding where pump energy is not applied; and
one or more sections of a layer of a second material coating the outer cladding, the layer of the second material being anti-reflective to pump energy applied to the pump cavity section and being disposed on areas of the outer cladding where pump energy is applied.

16. The laser pump cavity according to claim 14, wherein the outer cladding in each pump cavity segment has an outer cross-sectional shape that is circular or elliptical.

17. The laser pump cavity according to claim 14, wherein the outer cladding in each pump cavity segment has an outer cross-sectional shape that is polygonally-shaped.

18. The laser pump cavity according to claim 14, wherein the laser rod in each pump cavity segment comprises neodymium-doped yttrium aluminum garnet.

19. The laser pump cavity according to claim 14, wherein the laser rod in each pump cavity segment comprises ytterbium-doped yttrium aluminum garnet.

20. The laser pump cavity according to claim 14, wherein the outer cladding in each pump cavity segment comprises yttrium aluminum garnet.

21. The laser pump cavity according to claim 14, wherein the outer cladding in each pump cavity segment comprises samarium-doped yttrium aluminum garnet.

22. The laser pump cavity according to claim 14, wherein the extension segments comprise undoped material.

23. The laser pump cavity according to claim 14, wherein at least one of the extension segments comprises saturable absorber material.

24. The laser pump cavity according to claim 14, wherein the extended laser pump cavity has a first end and a second end and the extended laser pump cavity further comprises:
one or more end segments disposed at the first end, or the second end, or both ends of the extended laser pump cavity, the end segments being diffusion bonded to the extended laser pump cavity.

25. The laser pump cavity according to claim 14, further comprising:
one or more heats sinks surrounding each pump cavity segment and being disposed against the outer cladding of the pump cavity segment to conduct heat from the outer cladding; and
one or more slits in the heat sinks, the slits extending to the outer cladding and having a width and length to allow pump energy to be coupled to the pump cavity segment at the one or more slits.

26. The laser pump cavity according to claim 25, wherein the slits are disposed in pairs and each slit in the pairs of slits being disposed at an angle of 180° to the other slit in the pair, the angle being measured from a center of the pump cavity section to the slit.

27. The laser pump cavity according to claim 25, wherein the slits are disposed in pairs and each slit in the pairs of slits being disposed at an angle of less than 180° to the other slit in the pair, the angle being measured from a center of the pump cavity section to the slit.

28. A method of fabricating a laser pump cavity with a core having a polygonally-shaped cross-section, the method comprising the steps of:
(a) specifying the polygonal shape for the cross-section of the core;
(b) providing a core material slab having an upper surface, a lower surface, a longitudinal axis, a first optically flat side surface, and a second optically flat side surface opposite the first optically flat side surface, the first and the second optically flat side surfaces disposed between and generally perpendicular to the upper surface and the lower surface, the longitudinal axis being perpendicular to the upper and lower surfaces and parallel to the first and second optically flat side surfaces;
(c) providing a plurality of cladding material slabs, each slab having at least one optically flat surface;
(d) diffusion bonding the optically flat surface of one slab of the plurality of cladding material slabs to the first optically flat side surface of the core material slab;
(e) diffusion bonding the optically flat surface of another slab of the plurality of cladding material slabs to the second optically flat side surface of the core material slab to form a composite structure;
(f) grinding and polishing the composite structure to remove at least some portion of the core material remaining from the core material slab to provide a new optically flat side surface comprising at least some portion of the core material slab the longitudinal axis being parallel to the new optically flat side surfaces;
(g) diffusion bonding the optically flat surface of another slab of the plurality of cladding material slabs to the new optically flat side surface comprising at least some portion of the core material slab of the composite structure; and
(h) repeating steps (f) and (g) until the core material from the core material slab is completely surrounded by cladding material to provide the laser pump cavity wherein the cross-section of the core has the specified polygonal shape.

29. The method of claim 28 wherein the cladding material slabs comprise cladding material that is substantially transmissive to pump energy at a first wavelength and is substantially absorptive to laser energy at a second wavelength.

30. The method of fabricating a laser pump cavity according to claim 28 further comprising the steps of: (i) specifying a cross-sectional shape for the outer cladding of the laser pump cavity; and (j) grinding and polishing the outer cladding of the laser pump cavity until the outer cladding of the laser pump cavity has the specified cross-sectional shape.

31. The method of fabricating a laser pump cavity according to claim 30 further comprising the step of:
(k) coating the outer surface of the laser pump cavity with one or more anti-reflective coatings, one or more highly reflective coatings, or both anti-reflective and highly reflective coatings.

32. The method of fabricating a laser pump cavity according to claim 29 further comprising the steps of:
(i) specifying a cross-sectional shape for the outer cladding of the laser pump cavity;

(j) core-drilling the laser pump cavity to extract the core and surrounding cladding material to provide a cored laser pump cavity;

(k) grinding and polishing the outer cladding of the cored laser pump cavity until the outer cladding of the cored laser pump cavity has the specified cross-sectional shape.

33. The method of fabricating a laser pump cavity according to claim 32 further comprising the step of:

(l) coating the outer surface of the cored laser pump cavity with one or more anti reflective coatings, one or more highly reflective coatings, or both anti-reflective and highly reflective coatings.

34. The method of fabricating a laser pump cavity according to claim 28 wherein the core material slab comprises doped yttrium aluminum garnet.

35. The method of fabricating a laser pump cavity according to claim 28 wherein each cladding material slab comprises yttrium aluminum garnet.

36. The composite structure according to claim 1, wherein the outer cladding comprises areas that are highly reflective to the pump energy.

37. The composite structure according to claim 36, wherein the outer cladding further comprises areas that are anti-reflective to the pump energy.

* * * * *